(12) United States Patent
Park

(10) Patent No.: US 10,839,903 B2
(45) Date of Patent: Nov. 17, 2020

(54) RESISTIVE MEMORY DEVICES

(71) Applicant: Samsung Electronics Co., Ltd., Suwon-si (KR)

(72) Inventor: Hyun-Kook Park, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/454,713

(22) Filed: Jun. 27, 2019

(65) Prior Publication Data

US 2020/0051632 A1    Feb. 13, 2020

(30) Foreign Application Priority Data

Aug. 8, 2018  (KR) .................... 10-2018-0092667

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0004* (2013.01); *G11C 13/0026* (2013.01); *G11C 13/0028* (2013.01); *G11C 13/0097* (2013.01)

(58) Field of Classification Search
CPC .......... G11C 13/0069; G11C 13/0004; G11C 13/0026; G11C 13/0028; G11C 13/003; G11C 13/004; G11C 13/0097
See application file for complete search history.

(56) References Cited

U.S. PATENT DOCUMENTS

| | | | |
|---|---|---|---|
| 7,106,618 B2 | 9/2006 | Morimoto | |
| 7,286,395 B2 | 10/2007 | Chen et al. | |
| 7,345,907 B2 | 3/2008 | Scheuerlein | |
| 7,411,815 B2 | 8/2008 | Gogl | |
| 7,426,128 B2 | 9/2008 | Scheuerlein | |
| 7,808,831 B2 | 10/2010 | Mokhlesi et al. | |
| 7,864,588 B2 | 1/2011 | Betser et al. | |
| 9,286,975 B2 | 3/2016 | Chu et al. | |

(Continued)

OTHER PUBLICATIONS

Derchang Kau et. al., A Stackable Cross Point Phase Memory, IEDM 2009.

(Continued)

*Primary Examiner* — Toan K Le
(74) *Attorney, Agent, or Firm* — Harness, Dickey & Pierce, P.L.C.

(57) ABSTRACT

A resistive memory device includes a memory cell array including a memory cell connected between a first signal line and a second signal line, an instance of control circuitry configured to generate a write control signal to control a data writing operation performed on the memory cell and a read control signal to control a data reading operation of reading data stored in the memory cell, a write circuit configured to supply a write current to support the data writing operation, a read circuit configured to supply a read current to support the data reading operation, a column decoder circuit configured to electrically connect the write circuit to the first signal line, based on the write control signal; and a row decoder circuit configured to electrically connect the read circuit to the second signal line, based on the read control signal.

17 Claims, 13 Drawing Sheets

(56) References Cited

U.S. PATENT DOCUMENTS

| | | | |
|---|---|---|---|
| 9,437,293 B1 | 9/2016 | Kripanidhi et al. | |
| 9,870,819 B2 | 1/2018 | Shiimoto | |
| 9,892,788 B2 | 2/2018 | Uejima | |
| 2007/0008773 A1 | 1/2007 | Scheuerlein | |
| 2010/0118593 A1* | 5/2010 | Cho | H01L 29/868 365/148 |
| 2012/0161780 A1* | 6/2012 | Choi | G11C 29/1201 324/537 |
| 2013/0208529 A1* | 8/2013 | Tomotani | G11C 29/50008 365/148 |
| 2015/0318025 A1* | 11/2015 | Park | G11C 7/12 365/63 |
| 2017/0032838 A1* | 2/2017 | Park | G11C 13/0002 |
| 2018/0175109 A1* | 6/2018 | Choi | G11C 13/0004 |

OTHER PUBLICATIONS

Dong-Seok Suh et. al. Thermoelectric heating of in Ge2Sb2Te5 in phase change memory devices, Applied Physical Letters, 2010.

* cited by examiner

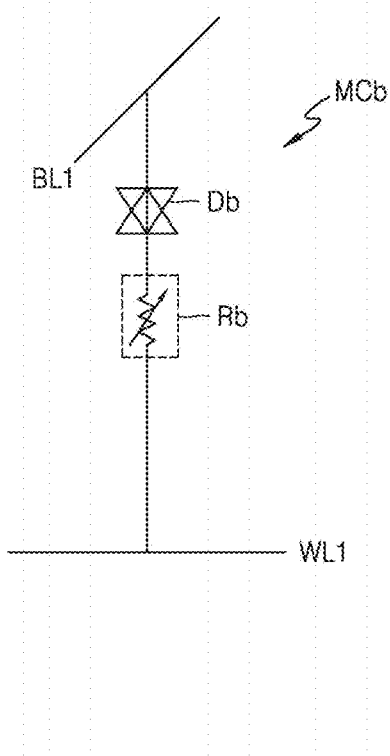

RESISTIVE MEMORY DEVICES

CROSS-REFERENCE TO RELATED APPLICATION

This application claims the benefit of Korean Patent Application No. 10-2018-0092667, filed on Aug. 8, 2018, in the Korean Intellectual Property Office, the disclosure of which is incorporated herein in its entirety by reference.

BACKGROUND

The inventive concepts relate to resistive memory devices, and more particularly, to resistive memory devices to which write currents and read currents are applied in different directions.

As memory devices are desired to have larger storage capacity and reduced power consumption, next-generation memory devices, which are non-volatile and do not need a refresh operation, are being researched. Next-generation memory devices may have the high integration of dynamic random access memory (DRAM), the non-volatility of flash memory, and the high speed of static random access memory (SRAM). Some next-generation memory devices, which are currently attracting much attention and satisfy the above-described requirements, include phase change random access memory (PRAM), nano floating gate memory (NFGM), polymer random access memory (PoRAM), magnetic random access memory (MRAM), ferroelectric random access memory (FeRAM), and resistive random access memory (ReRAM).

SUMMARY

Some example embodiments of the inventive concepts provide resistive memory devices which are configured to reduce degradation caused by a spike current occurring when reading data.

According to some example embodiments of the inventive concepts, a resistive memory device may include a plurality of first signal lines and a plurality of second signal lines. Each second signal line of the plurality of second signal lines may intersect each first signal line of the plurality of first signal lines. The resistive memory device may include a memory cell array including a plurality of memory cells. Each memory cell of the plurality of memory cells may be connected at a first end to one first signal line of the plurality of first signal lines and may be connected at a second end to one second signal line of the plurality of second signal lines. The resistive memory device may include a write circuit configured to supply a write current to at least one memory cell of the plurality of memory cells through at least one first signal line of the plurality of first signal lines, the write current associated with writing data in the at least one memory cell. The resistive memory device may include a read circuit configured to supply a read current to the at least one memory cell of the plurality of memory cells through at least one second signal line of the plurality of second signal lines, the read current associated with reading data stored in the at least one memory cell.

According to some example embodiments of the inventive concepts, a resistive memory device may include a plurality of first signal lines spaced apart from one another in a first direction, the plurality of first signal lines each extending in a second direction perpendicular to the first direction. The resistive memory device may include a plurality of second signal lines spaced apart from one another in the second direction, the plurality of second signal lines each extending in the first direction, the plurality of second signal lines spaced apart from the plurality of first signal lines in a third direction, the third direction perpendicular to both the first direction and the second direction. The resistive memory device may include a memory cell array including a plurality of memory cells. Each memory cell of the plurality of memory cells may be connected at a first end to one first signal line of the plurality of first signal lines and may be connected at a second end to one second signal line of the plurality of second signal lines. The resistive memory device may include a write circuit configured to supply a write current to at least one memory cell of the plurality of memory cells, such that the write current flows from a corresponding first signal line of the plurality of first signal lines to a corresponding second signal line of the plurality of second signal lines via the at least one memory cell, the write current associated with writing data in the at least one memory cell. The resistive memory device may include a read circuit configured to supply a read current to the at least one memory cell, such that the read current flows from the corresponding second signal line to the corresponding first signal line via the at least one memory cell, the read current associated with reading data stored in the at least one memory cell.

According to some example embodiments of the inventive concepts, a resistive memory device may include a memory cell array including a memory cell connected between a first signal line and a second signal line. The resistive memory device may include an instance of control circuitry configured to generate a write control signal to control a data writing operation performed on the memory cell and a read control signal to control a data reading operation of reading data stored in the memory cell. The resistive memory device may include a write circuit configured to supply a write current to support the data writing operation, a read circuit configured to supply a read current to support the data reading operation, a column decoder circuit configured to electrically connect the write circuit to the first signal line, based on the write control signal, and a row decoder circuit configured to electrically connect the read circuit to the second signal line, based on the read control signal.

BRIEF DESCRIPTION OF THE DRAWINGS

Example embodiments of the inventive concepts will be more clearly understood from the following detailed description taken in conjunction with the accompanying drawings in which:

FIGS. 5A to 5C are circuit diagrams respectively illustrating example embodiments of a memory cell of FIG. 4;

DETAILED DESCRIPTION OF THE EMBODIMENTS

Hereinafter, example embodiments will be described in detail with reference to the accompanying drawings.

Figure 1:
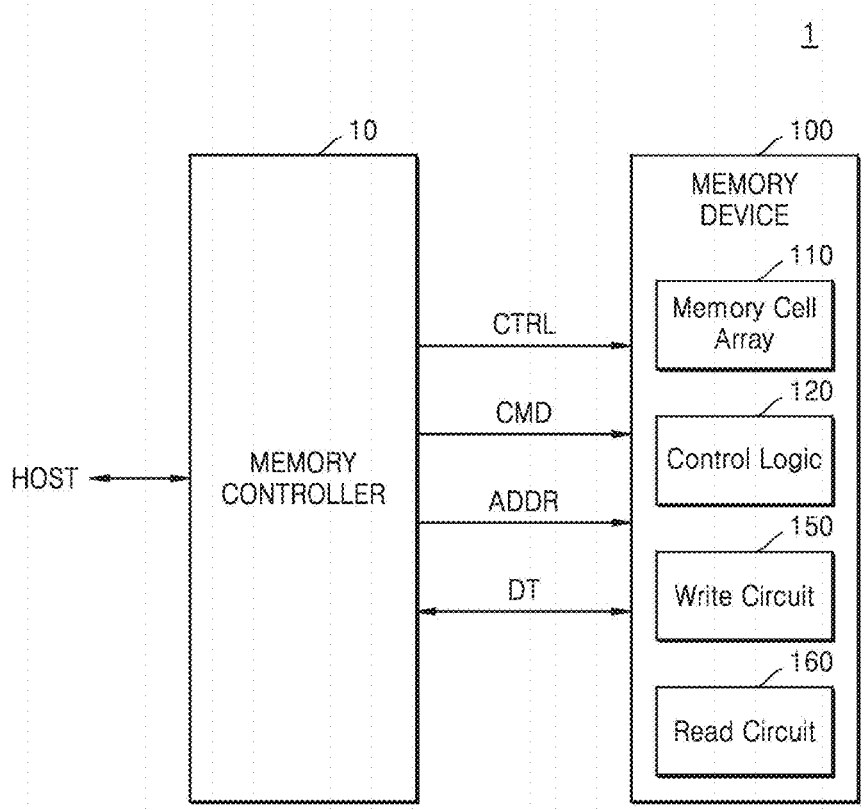
FIG. 1 is a block diagram illustrating a memory system according to some example embodiments.

FIG. 1 is a block diagram illustrating a memory system 1 according to some example embodiments.

Referring to FIG. 1, the memory system 1 may include a memory controller 10 and a memory device 100. The memory controller 10 may be implemented by one or more instances of circuitry, including an instance of processing circuitry (e.g., a processor device). The memory device 100 may include a memory cell array 110, a control logic 120, a write circuit 150, and a read circuit 160. In some example embodiments, the memory device 100 may further include a plurality of circuits which perform a write operation and a read operation on the memory cell array 110 according to control by the control logic 120. The memory cell array 110 may include a plurality of resistive memory cells. Accordingly, the memory device 100 may be referred to as a resistive memory device, and the memory system 1 may be referred to as a resistive memory system. It will be understood, as described above, that the control logic 120 may be an instance of control circuitry, of the memory device 100, including a processor, instance of processing circuitry, some combination thereof, or the like.

Figure 2:
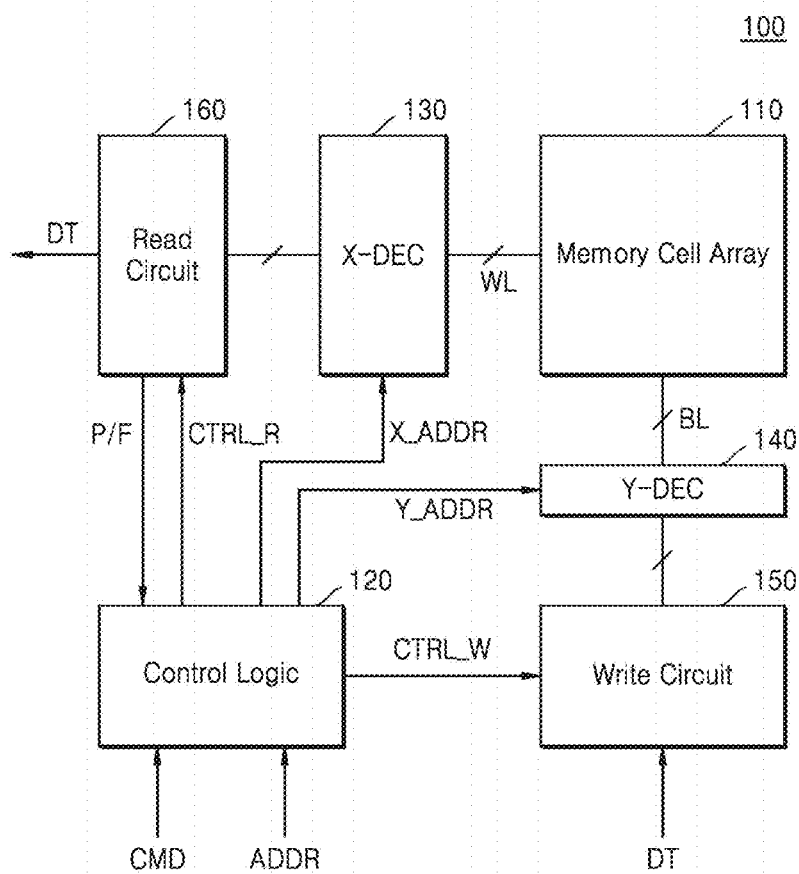
FIG. 2 is a block diagram of a memory device according to some example embodiments.

Referring to FIG. 1 and further referring to FIG. 2, the memory device 100 may include an internal data bus, and one or more of the elements of the memory device 100, for example as shown in FIG. 2, may be communicatively coupled to each other via the internal data bus of the memory device 100.

In response to a write/read request from a host HOST, the memory controller 10 may control the memory device 100 to write data in the memory device 100 or to read data stored in the memory device 100. In detail, the memory controller 10 may provide an address ADDR, a command CMD, and a control signal CTRL to the memory device 100 to control a program (e.g., write) operation, a read operation, and an erase operation on the memory device 100. In some example embodiments, data DT, which is to be written, and read data DT may be transferred or received between the memory controller 10 and the memory device 100. For example, when a plurality of memory cells (not shown) included in the memory cell array 110 are arranged in rows and columns, the address ADDR may include a row address and a column address.

Although not shown, the memory controller 10 may further include random access memory (RAM), a processor, a host interface, and a memory interface. The RAM may be used as a working memory, and the processor may control an operation of the memory controller 10. The host interface may include a protocol for performing data exchange between the host HOST and the memory controller 10. For example, the memory controller 10 may be configured to communicate with an external device (for example, a host) through at least one of various interface protocols such as universal serial bus (USB), multimedia card (MMC), peripheral component interconnection express (PCI-E), advanced technology attachment (ATA), serial-ATA (SATA), parallel-ATA (PATA), small computer system interface (SCSI), enhanced small disk interface (ESDI), and integrated drive electronics (IDE).

The memory cell array 110 may include the plurality of memory cells (not shown), which are respectively provided in a plurality of regions defined by intersections of a plurality of first signal lines and a plurality of second signal lines, where each second signal line of the plurality of second signal lines intersect each first signal line of the plurality of first signal lines. In some example embodiments, the plurality of first signal lines may be a plurality of word lines, and the plurality of second signal lines may be a plurality of bit lines. In some example embodiments, the plurality of first signal lines may be a plurality of bit lines, and the plurality of second signal lines may be a plurality of word lines. The memory device 100 including the memory cell array 110 may be referred to as a cross-point memory device.

The memory cell array 110 may include the plurality of memory cells arranged in rows and columns. In some example embodiments, the plurality of memory cells may include a plurality of resistive memory cells each including a variable resistor (not shown). For example, when the variable resistor includes a phase change material (for example, Ge—Sb—Te (GST)) and has a resistance which varies based on a temperature, the memory device 100 may include phase change RAM (PRAM). As another example, when the variable resistor includes a top electrode, a bottom electrode, and complex metal oxide therebetween, the memory device 100 may include resistive RAM (ReRAM). As another example, when the variable resistor includes a top electrode of a magnetic material, a bottom electrode of the magnetic material, and a dielectric therebetween, the memory device 100 may include magnetic RAM (MRAM). Hereinafter, an example where the memory device 100 includes PRAM will be described.

In some example embodiments, each of the plurality of memory cells may be a single level cell (SLC) which stores 1-bit data, and in this case, the memory cells may have two resistance distributions, based on stored data. In some example embodiments, each of the plurality of memory cells may be a multi-level cell (MLC) which stores 2-bit data, and in this case, the memory cells may have four resistance distributions, based on stored data. In some example embodiments, each of the plurality of memory cells may be a triple level cell (TLC) which stores 3-bit data, and in this case, the memory cells may have eight resistance distributions, based on stored data. However, the inventive concepts is not limited thereto. In some example embodiments, the memory cell array 110 may include memory cells which store data of 4 or more bits. In some example embodiments, the memory cell array 110 may include an SLC and an MLC or a TLC.

Moreover, in some example embodiments, the memory cell array 110 may include memory cells having a two-dimensional (2D) horizontal structure. In some example embodiments, the memory cell array 110 may include memory cells having a three-dimensional (3D) vertical structure.

The control logic 120 may control an overall operation of the memory device 100 and may control the write circuit 150 and the read circuit 160, for performing a memory operation including a write operation and a read operation. For example, the memory device 100 may include a power generating means (not shown) which generates various voltages used for the write operation and the read operation, and levels of the voltages may be adjusted based on control by the control logic 120.

The write circuit 150 may perform a write operation on the memory cells. The write circuit 150 may include a write driver which is connected to the memory cells through a plurality of bit lines or a plurality of word lines and writes data in the memory cells.

The read circuit 160 may perform the read operation on data stored in each of the memory cells. The read circuit 160 may include a sense amplifier which is connected to the memory cells through the plurality of bit lines or the plurality of word lines and amplifies data read from each of the memory cells.

In some example embodiments, the write circuit 150 and the read circuit 160 may respectively provide ("supply," "apply," etc.) a write current and a read current to each of the memory cells through different signals. For example, the write circuit 150 may provide the write current to the memory cells through the word lines, and the read circuit 160 may provide the read current to the memory cells through the bit lines. As another example, the write circuit 150 may provide the write current to the memory cells through the bit lines, and the read circuit 160 may provide the read current to the memory cells through the word lines.

According to some example embodiments, the write current and the read current may be input to each of the memory cells in different directions, and thus, thermoelectric cooling may selectively occur in the memory cells. For example, when each of the memory cells includes a variable resistor and a heating element, the write current may be applied in a direction (for example, a direction in which heat transfer increases) from the heating element to the variable resistor. In some example embodiments, the read current may be applied in a direction (for example, a direction in which heat transfer increases) from the variable resistor to the heating element. Therefore, in the inventive concepts, spike current induced read disturb (SIRD) occurring when reading data may be reduced and the reliability of data may be enhanced.

The memory controller 10 and the memory device 100 may be integrated into one semiconductor device. For example, the memory controller 10 and the memory device 100 may be integrated into one semiconductor device to configure a memory card. For example, the memory controller 10 and the memory device 100 may be integrated into one semiconductor device to configure a personal computer card (PCMCIA), a compact flash card (CF), a smart media card (SM/SMC), a memory stick, a multimedia card (MMC, RS-MMC, or MMCmicro), a secure digital (SD) card (SD, miniSD, or microSD), a universal flash storage (UFS), or the like. As another example, the memory controller 10 and the memory device 100 may be integrated into one semiconductor device to configure a solid state disk/drive (SSD).

FIG. 2 is a block diagram of a memory device 100 according to some example embodiments. FIG. 2 may be, for example, a detailed block diagram of the memory device 100 of FIG. 1.

Referring to FIG. 2, the memory device 100 may include a memory cell array 110, a control logic 120, a row decoder 130, a column decoder 140, a write circuit 150, and a read circuit 160. As indicated above, the control logic 120 may be referred to as a control circuit. The row decoder 130 may be referred to herein as a row decoder circuit. The column decoder 140 may be referred to herein as a column decoder circuit. Hereinafter, elements included in the memory device 100 will be described in detail.

A plurality of memory cells included in the memory cell array 110 may be connected to a plurality of first signal lines and a plurality of second signal lines. In some example embodiments, the plurality of first signal lines may be a plurality of word lines WL, and the plurality of second signal lines may be a plurality of bit lines BL. Various voltage signals or current signals may be provided through the plurality of word lines WL and the plurality of bit lines BL. Therefore, data DT may be written in or read from selected memory cells, and a write or read operation may be prevented from being performed on the other unselected memory cells. Hereinafter, in the present specification, a selection memory cell may denote a memory cell, on which a memory operation such as a write operation, a read operation, and/or an erase operation is performed, of the plurality of memory cells. In some example embodiments, a non-selection memory cell may denote a memory cell, other than the selection memory cell, of the plurality of memory cells.

The control logic 120 may write the data DT in the memory cell array 110 or may output various control signals (for example, a read control signal CTRL R and a write control signal CTRL_W) for writing the data DT in the memory cell array 110, based on a command CMD, an address ADDR, and a control signal CTRL received from the memory controller 10. Therefore, the control logic 120 may overall control various operations of the memory device 100.

The control logic 120 may receive the address ADDR for indicating a memory cell which is to be accessed, based on the command CMD, and the address ADDR may include a row address X_ADDR for selecting the word lines WL of the memory cell array 110 and a column address Y_ADDR for selecting the bit lines BL of the memory cell array 110. The address ADDR provided to the memory device 100 may correspond to a physical address obtained through conversion which is performed in a memory system, based on a logical address from a host.

The row decoder 130 may perform a word line selection operation in response to the row address X_ADDR. In some example embodiments, the row decoder 130 may be connected to the read circuit 160 and may perform control in order for a read current output from the read circuit 160 to be applied to some of the word lines WL, based on the row address X_ADDR. The row decoder 130 may electrically connect the read circuit 160 to at least one second signal line of the plurality of second signal lines (e.g., word lines WL) of the memory device 100 based on a read control signal CTRL_R generated by the control logic 120. A word line, to which the read current is applied, of the word lines WL may be referred to as a selection word line. The read circuit 160 may read the data DT according to the read current being applied to selection memory cells. In some example embodiments, the read circuit 160 may provide a pass/fail signal P/F to the control logic 120, based on a result of determination performed on the read data DT. The control logic 120 may control a write operation and a read operation of the memory cell array 110 with reference to the pass/fail signal P/F.

The column decoder 140 may perform a bit line selection operation in response to the column address Y_ADDR. In some example embodiments, the column decoder 140 may be connected (e.g., electrically connected) to the write circuit 150. The column decoder 140 may perform control in order for a write current output from the write circuit 150 to be applied to some of the bit lines BL, based on the column address Y_ADDR. The column decoder 140 may electrically connect the write circuit 150 to at least one first signal line of the plurality of first signal lines (e.g., bit lines BL) of the memory device 100 based on a write control signal CTRL_W generated by the control logic 120. A bit line, to which the write current is applied, of the bit lines BL may be referred to as a selection bit line. The write circuit 150 may write the data DT according to the write current being applied to selection bit lines.

In some example embodiments, it is illustrated that the write circuit 150 is connected to the bit lines BL through the column decoder 140 and the read circuit 160 is connected to the word lines WL through the row decoder 130. On the other hand, the write circuit 150 may be connected to the word lines WL through the row decoder 130, and the read circuit 160 may be connected to the bit lines BL through the column decoder 140. In other words, in the inventive concepts, the write current may be input to a memory cell through one of a first signal line and a second signal line, and the read current may be input to the memory cell through the other signal line. Accordingly, the write current and the read current may be input to each of the memory cells in different directions.

Figure 3:
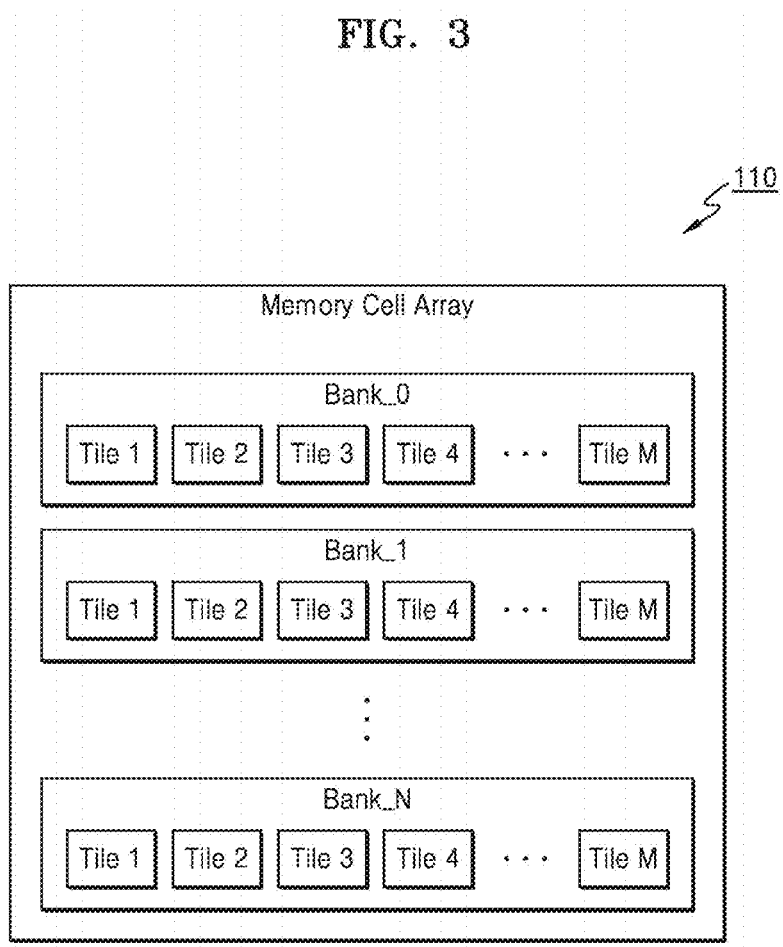
FIG. 3 is a block diagram illustrating a configuration of a memory cell array.

FIG. 3 is a block diagram illustrating a configuration of a memory cell array 110. For example, FIG. 3 may illustrate a configuration of the memory cell array 110 of FIG. 2.

Referring to FIG. 3, the memory cell array 110 may include a plurality of banks Bank_0 to Bank_N (where N is a positive integer). The plurality of banks Bank_0 to Bank_N may be arranged in one direction in the memory cell array 110. The plurality of banks Bank_0 to Bank_N may each include a plurality of tiles Tile 1 to Tile M (where M is a positive integer). For example, a bank may be one unit including the plurality of tiles Tile 1 to Tile M, and a tile may be one unit including a plurality of memory cells. In the drawing, for convenience of description, a unit of a bank and a unit of a tile are illustrated, but the present embodiments are not limited thereto. For example, a bank may be divided into a plurality of region units, a region may be divided into a plurality of bays, and a bay may be divided into a plurality of tile units.

Figure 4:
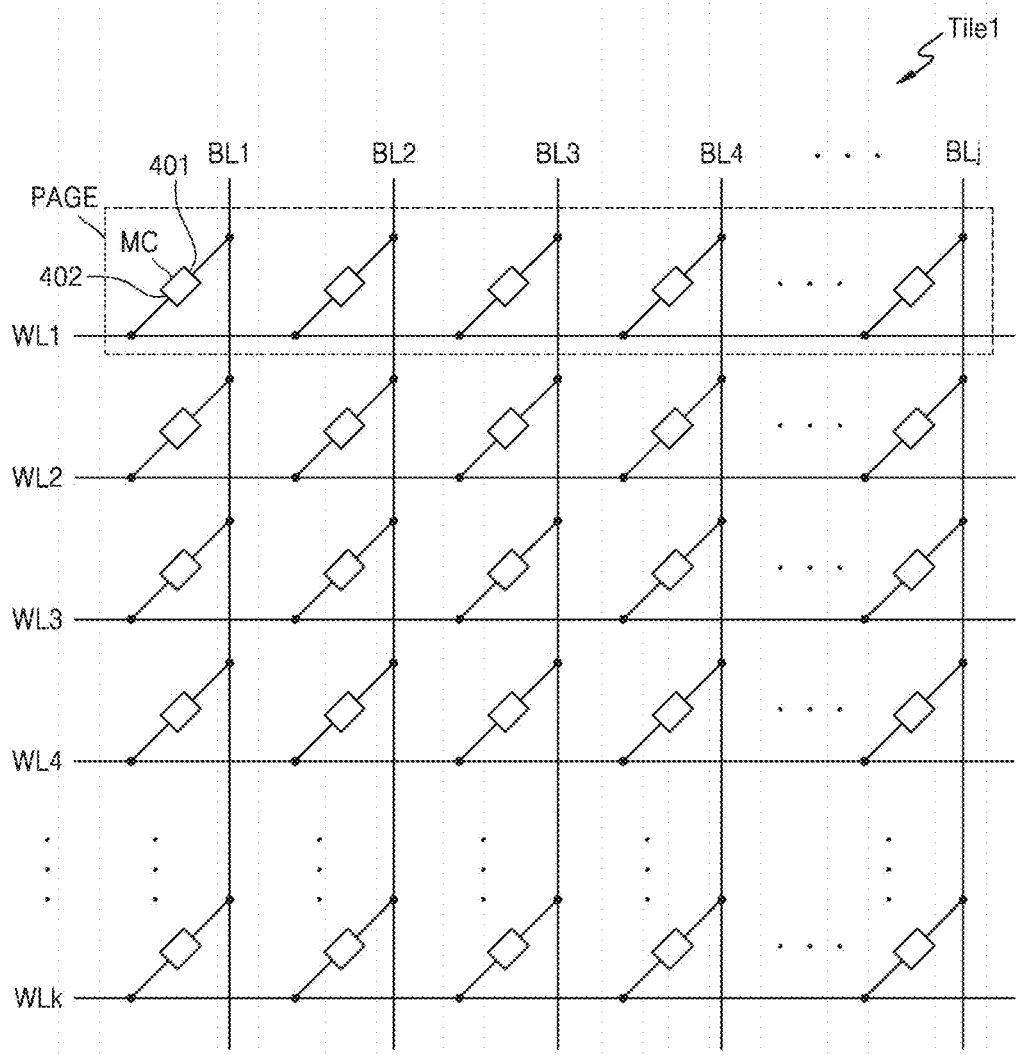
FIG. 4 is a circuit diagram illustrating a tile illustrated in FIG. 3 according to some example embodiments.

FIG. 4 is a circuit diagram illustrating an implementation example of the tile Tile 1 illustrated in FIG. 3.

Referring to FIG. 4, the tile Tile 1 may include a plurality of word lines WL1 to WLk (where k is a positive integer), a plurality of bit lines BL1 to BLj (where j is a positive integer), and a plurality of memory cells MC. As shown in FIG. 4, memory cells MC selected to the same word line may be defined as a page unit. Accordingly, it will be understood that the memory cell array 110 includes a plurality of memory cells MC. In some example embodiments, and as shown in FIG. 4, the plurality of first signal lines of the memory device 100 may include the plurality of bit lines BL1 to BLj, and the plurality of second signal lines of the memory device 100 may include the plurality of word lines WL1 to WLk, where each second signal line of the plurality of second signal lines (e.g., each word line WL1 to WLk) intersect each first signal line (e.g., each bit line BL1 to BLi). Here, the number of word lines WL1 to WLk, the number of bit lines BL1 to BLj, and the number of memory cells MC may be variously changed according to some example embodiments. In FIG. 4, a 2D memory having a horizontal structure is illustrated, but the inventive concepts is not limited thereto. In other embodiments, the tile Tile 1 may be a 3D memory having a vertical structure.

As shown in FIG. 4, each memory cell MC of the memory cells MC may be connected at a first end 401 to a bit line and may be connected at a second end 402 to a word line. Thus, as shown in FIG. 4, each memory cell MC of a plurality of memory cells of the memory cell array 110 may be connected at a first end 401 to one first signal line of a plurality of first signal lines (e.g., bit lines BL1 to BLj) and connected at a second end 402 to one second signal line of a plurality of second signal lines (e.g., word lines WL1 to WLk). In some example embodiments, a write current may be applied to each of the memory cells MC through one of a word line and a bit line connected to a corresponding memory cell MC, and a read current may be applied to each of the memory cells MC through the other line. For example, in a write operation, the write current may flow through a memory cell MC in a direction from a bit line to a word line, and in a read operation, the read current may flow through the memory cell MC in a direction from the word line to the bit line.

Figure 5A:
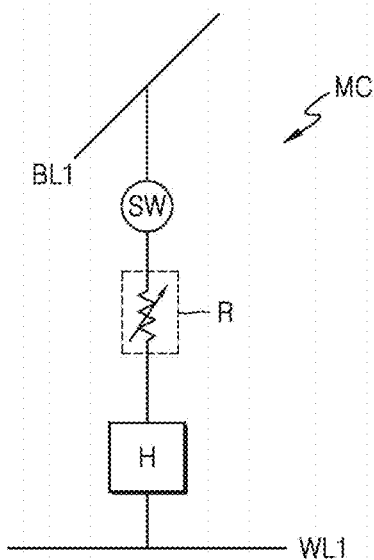
Figure 5B:
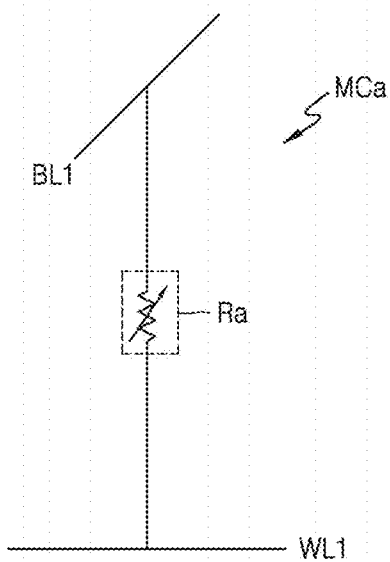

FIGS. 5A to 5C are circuit diagrams respectively illustrating embodiments of each of the memory cells MC of FIG. 4.

Referring to FIG. 5A, a memory cell MC may include a variable resistance element R, a selection element SW, and a heating element H. Here, the variable resistance element R may be referred to as a variable resistor (e.g., a variable resistance material), and the selection element SW may be referred to as a switching element. In some example embodiments, the heating element H may be referred to as a heating electrode (e.g., a heating electrode layer).

In some example embodiments, the variable resistance element R may be connected between the selection element SW and the heating element H, the selection element SW may be connected to a bit line BL1, and the heating element H may be connected to a word line WL1. In other words, and as shown in at least FIG. 5A, one end of the selection element SW may be connected to the bit line BL1 (e.g., one first signal line of a plurality of first signal lines of the memory device 100), and another end of the selection element SW may be connected to the variable resistance element R. In some example embodiments, and as shown in at least FIG. 5A, one end of the heating element H may be connected to the word line WL1 (e.g., one second signal line of a plurality of second signal lines of the memory device 100), and another end of the heating element H may be connected to the variable resistance element R. Thus, one end of the variable resistance element R may be connected to the selection element SW, and another end of the variable resistance element R may be connected to the heating element H.

The variable resistance element R may be changed to have one of a plurality of resistance states, based on an electrical pulse (for example, a write current) applied thereto. According to some example embodiments, the variable resistance element R may include a phase change material having a crystal state which varies based on the amount of current. The variable resistance element R may include a phase change material that has a resistance which varies based on a temperature of the phase change material. The phase change material may be various kinds of materials such as GaSb, InSb, InSe, $Sb_2Te_3$, and GeTe produced by mixing two elements, GeSbTe(GST), GaSeTe, InSbTe, $SnSb_2Te_4$, and InSbGe produced by mixing three elements, and AgInSbTe, (GeSn)SbTe, GeSb(SeTe), and $Te_{81}Ge_{15}Sb_2S_2$ produced by mixing four elements.

The phase change material may have an amorphous state where a resistance is relatively high and a crystal state where a resistance is relatively low. The phase change material may have a phase which is changed by Joule's heat generated based on the amount of current. In some example embodiments, data may be written by using a phase change. For example, a high resistance state (e.g., a reset state) may be defined as 0, and a low resistance state (e.g., a set state) may be defined as 1, whereby data may be stored in the variable resistance element R.

In some example embodiments, the variable resistance element R may include Perovskite compounds, transition metal oxide, magnetic materials, ferromagnetic materials, or antiferromagnetic material, instead of the phase change material.

The selection element SW may control the supply of a current to the variable resistance element R, based on a current or a voltage applied to the word line WL1 connected thereto. The selection element SW may include and/or be an ovonic threshold switch (OTS) including a chalcogenide compound. The OTS may include a material including arsenic (As), germanium (Ge), selenium (Se), tellurium (Te), silicon (Si), bismuth (Bi), sodium (S), and antimony (Sb). Particularly, the OTS may include a six-element material where Se and S are added to a compound including Ge, Si, As, and Te.

The heating element H may heat the variable resistance element R when a data writing operation (for example, a reset/set operation) is being performed. The heating element H may include a conductive material which generates heat sufficient to cause a phase change of the variable resistance element R without reacting with the variable resistance element R. For example, the heating element H may include a carbon-based conductive material.

In some example embodiments, the heating element H may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), SiC, SiCN, carbon nitride (CN), TiCN, TaCN, or a refractory metal corresponding to a combination thereof, or nitride thereof.

Referring to FIG. 5B, a memory cell MCa may include a variable resistance element Ra, and the variable resistance element Ra may be connected between a bit line BL1 and a word line WL1. The memory cell MCa may store data, based on a write current applied thereto through the bit line BL1. In some example embodiments, the data stored in the memory cell MCa may be read based on a read current applied thereto through the word line WL1. Restated, a write current applied to a memory cell (e.g., memory cell MCa) may be associated with writing data in the memory cell, and a read current applied to a memory cell (e.g., memory cell MCa) may be associated with reading data stored in the memory cell.

Referring to FIG. 5C, a memory cell MCb may include a variable resistance element Rb and a bidirectional diode Db. The variable resistance element Rb may include a resistance material for storing data. The bidirectional diode Db may be connected between the variable resistance element Rb and a bit line BL1, and the variable resistance element Rb may be connected between a word line WL1 and the bidirectional diode Db. The bidirectional diode Db may cut off a leakage current flowing to a non-selection resistance memory cell.

Figure 6A:
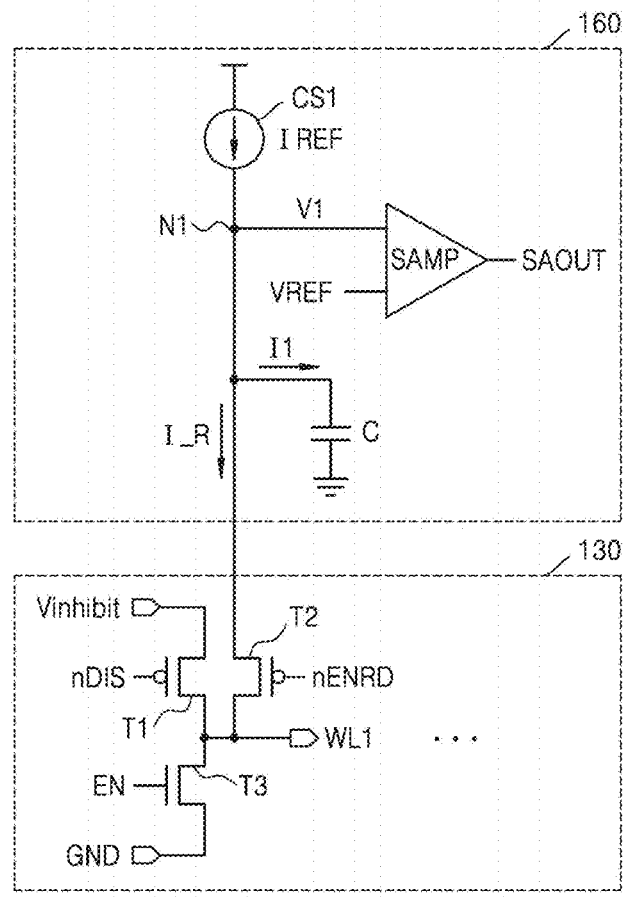
FIG. 6A is a circuit diagram illustrating a configuration of each of a row decoder and a read circuit according to some example embodiments.
Figure 6B:
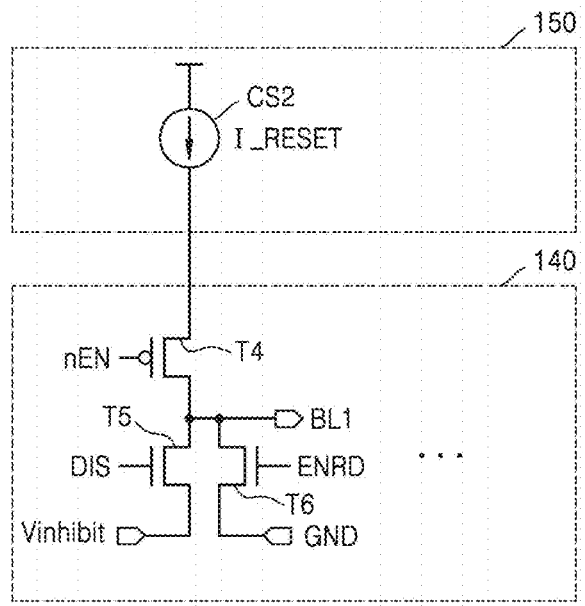
FIG. 6B is a circuit diagram illustrating a configuration of each of a column decoder and a write circuit according to some example embodiments.

FIG. 6A is a circuit diagram illustrating a configuration of each of a row decoder and a read circuit according to some example embodiments. FIG. 6B is a circuit diagram illustrating a configuration of each of a column decoder and a write circuit according to some example embodiments. Hereinafter, FIGS. 6A and 6B will be described with reference to FIG. 2.

Referring to FIG. 6A, a read circuit 160 may include a first current source CS1, a sense amplifier SAMP, and a capacitor C. The first current source CS1 may output a reference current IREF. A portion of the reference current IREF may be applied as a read current I_R to a row decoder 130, and the other current I1 may be charged into the capacitor C. One end of the capacitor C may be connected to a ground voltage GND, and another end thereof may be connected to a first node N1. For example, the capacitor C may be a parasitic capacitor of a word line WL1. As another example, the capacitor C may be a capacitor which is provided in or outside the memory cell array 110, for reading data.

The sense amplifier SAMP may include an input terminal to which the reference voltage VREF is applied and an input terminal connected to the first node N1. The sense amplifier SAMP may compare the reference voltage VREF with a first voltage V1 (i.e., a voltage applied to the capacitor C) of the first node N1 to output a comparison result SAOUT.

The row decoder 130 may include a first transistor T1, a second transistor T2, and a third transistor T3. The first transistor T1 may receive a complementary non-selection signal nDIS as a gate voltage. As shown in FIG. 6A, one end (e.g., a source end) of the first transistor T1 may be connected to an inhibit voltage Vinhibit, and another end (e.g., a drain end) thereof may be connected to the word line WL1 (e.g., one second signal line of the plurality of second signal lines of the memory device 100). The second transistor T2 may receive a complementary read enable signal nENRD as a gate voltage. As shown in FIG. 6A, one end (e.g., a source end) of the second transistor T2 may be connected to the first node N1 (and thus connected to the read circuit 160), and another end (e.g., a drain end) thereof may be connected to the word line WL1 (e.g., the same second signal line to which the other end of the first transistor T1 is connected). The third transistor T3 may receive a write enable signal EN as a gate voltage. As shown in FIG. 6A, one end (e.g., a source end) of the third transistor T3 may be connected to the ground voltage GND, and another end (e.g., a drain end) thereof may be connected to the word line WL1 (e.g., the same second signal line to which the other end of the first transistor T1 is connected and the other end of the second transistor T2 is connected).

The complementary non-selection signal nDIS, the complementary read enable signal nENRD, and the write enable signal EN may be applied from the control logic 120. In some example embodiments, the complementary non-selection signal nDIS, the complementary read enable signal nENRD, and the write enable signal EN may be applied from the control logic 120 based on the read control signal CTRL_R, such that the first to third transistors T1 to T3 may be configured to switch ("to be switched") according to control based on the read control signal CTRL_R. In some example embodiments, it is illustrated that each of the first and second transistors T1 and T2 is a P-channel metal oxide semiconductor (PMOS) transistor and the third transistor T3 is an N-channel metal oxide semiconductor (NMOS) transistor. This is merely some example embodiments without being limited thereto.

Referring to FIG. 6B, a write circuit 150 may include a second current source CS2. The second current source CS2 may output a write current (for example, a reset current I_RESET). In some example embodiments, for convenience of description, an example where the write current is the reset current I_RESET will be described below, but it may be understood by those of ordinary skill in the art that the write circuit 150 may further include a current source which outputs a set current as the write current.

A column decoder 140 may include a fourth transistor T4, a fifth transistor T5, and a sixth transistor T6. The fourth transistor T4 may receive a complementary write enable signal nEN as a gate voltage. As shown in FIG. 6B, one end (e.g., a source end) of the fourth transistor T4 may be connected to the second current source CS2 (and thus the write circuit 150), and another end (e.g., a drain end) thereof may be connected to a bit line BL1 (e.g., one first signal line of the plurality of first signal lines of the memory device 100). The fifth transistor T5 may receive a non-selection signal DIS as a gate voltage. As shown in FIG. 6B, one end (e.g., a source end) of the fifth transistor T5 may be connected to the bit line BL1 (e.g., the same first signal line to which the other end of the fourth transistor T4 is connected), and another end (e.g., a drain end) thereof may be connected to the inhibit voltage Vinhibit. The sixth transistor T6 may receive a read enable signal ENRD as a gate voltage. As shown in FIG. 6B, one end (e.g., a source end) of the sixth transistor T6 may be connected to the ground voltage GND, and another end (e.g., a drain end) thereof may be connected to the bit line BL1 (e.g., the same first signal line to which the other end of the fourth transistor T4 is connected and the other end of the fifth transistor T5 is connected).

The non-selection signal DIS, the read enable signal ENRD, and the complementary write enable signal nEN may be applied from the control logic 120. In some example embodiments, the non-selection signal DIS, the read enable signal ENRD, and the complementary write enable signal nEN may be applied from the control logic 120 may be applied from the control logic 120 based on the write control signal CTRL_W, such that the fourth to sixth transistors T4 to T6 may be configured to switch ("to be switched") according to control based on the write control signal CTRL_W. In some example embodiments, it is illustrated that the fourth transistor T4 is a PMOS transistor and each of the fifth and sixth transistors T5 and T6 is an NMOS transistor. This is merely some example embodiments without being limited thereto.

For example, when the word line WL1 is an unselected word line, the first transistor T1 may be turned on ("switched on") and the second and third transistors T2 and T3 may be turned off ("switched off"). Therefore, the inhibit voltage Vinhibit may be applied to the unselected word line. In some example embodiments, when the bit line BL1 is an unselected bit line, the fifth transistor T5 may be turned on, and the fourth and sixth transistors T4 and T6 may be turned off.

Therefore, the inhibit voltage Vinhibit may be applied to the unselected bit line. Hereinafter, in some example embodiments, an example where the word line WL1 is a selected word line and the bit line BL1 is an unselected bit line will be described below.

In a data reading operation, the second transistor T2 of the row decoder 130 may be turned on and the first and third transistors T1 and T3 may be turned off. Restated, the data reading operation may include switching the second transistor T2 on and switching both the first transistor T1 and the third transistor T3 off. In some example embodiments, in the data reading operation, the sixth transistor T6 of the column decoder 140 may be turned on and the fourth and fifth transistors T4 and T5 may be turned off. Restated, the data reading operation may include switching the sixth transistor T6 on and switching both the fourth transistor T4 and the fifth transistor T5 off. Therefore, the read current I_R may be applied to, through the word line WL1, a memory cell MC connected to the word line WL1 and the bit line BL1. That is, the read current I_R may flow through the word line WL1, the memory cell MC, and the bit line BL1.

In a data writing operation, the third transistor T3 of the row decoder 130 may be turned on and the first and second transistors T1 and T2 may be turned off. Restated, the data writing operation may include switching the third transistor T3 on and switching both the first transistor T1 and the second transistor T2 off. In some example embodiments, in the data writing operation, the fourth transistor T4 of the column decoder 140 may be turned on and the fifth and sixth transistors T5 and T6 may be turned off. Restated, the data writing operation may include switching the fourth transistor T4 on and switching both the fifth transistor T5 and the sixth transistor T6 off. Therefore, the write current I_RESET may be applied to the memory cell MC through the bit line BL1. That is, the write current I_RESET may flow through the bit line BL1, the memory cell MC, and the word line WL1.

Figure 7A:
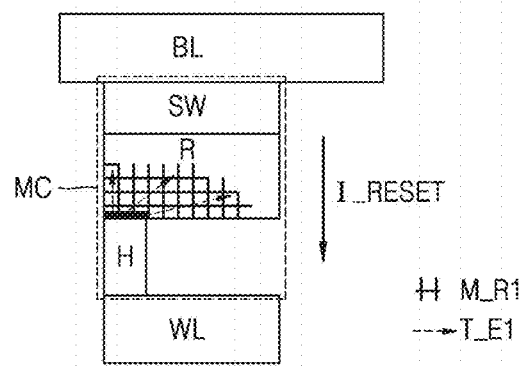
FIG. 7A is a diagram illustrating a movement of a column when performing a data writing operation according to some example embodiments.
Figure 7B:
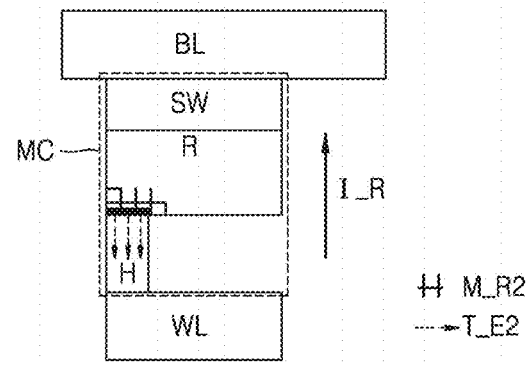
FIG. 7B is a diagram illustrating a movement of a column when performing a data reading operation according to some example embodiments.

FIG. 7A illustrates a movement of a column when performing a data writing operation according to some example embodiments, and FIG. 7B illustrates a movement of a column when performing a data reading operation according to some example embodiments.

Referring to FIG. 7A, a write current I_RESET may flow through a bit line BL, a memory cell MC, and a word line WL. In some example embodiments, the memory cell MC may include a heating element H which is connected to the word line WL at one side thereof and is connected to a variable resistance element R at the other side thereof, the variable resistance element R which is connected to the heating element H at one side thereof and is connected to a selection element SW at the other side thereof, and the selection element SW which is connected to the variable resistance element R at one side thereof and is connected to the bit line BL at the other side thereof. Although not shown, a middle electrode may be further provided between the selection element SW and the variable resistance element R, and a top electrode may be further provided between the bit line BL and the selection element SW.

Therefore, the write current I_RESET may flow in a direction toward the selection element SW, the variable resistance element R, and the heating element H. Since the write current I_RESET flows as described above, heat may occur in the heating element H and may be transferred in a first direction T_E1, namely, a direction from the heating element H to the variable resistance element R. Due to the heat transferred from the heating element H, a phase change may occur in a portion M_R1 of the variable resistance element R.

Referring to FIG. 7B, a read current I_R may flow through the word line WL, the memory cell MC, and the bit line BL. Therefore, the read current I_R may flow in a direction toward the heating element H, the variable resistance element R, and the selection element SW. Since the read current I_R flows as described above, heat may occur in the heating element H and may be transferred in a second direction T_E2 (i.e., a direction from the variable resistance element R to the heating element H) which differs from the first direction T_E1. In other words, the heat occurring in the heating element H may be again absorbed by the variable resistance element R.

A movement direction of heat based on a direction of each of the write current I_RESET and the read current I_R may be affected by the Peltier effect or Thomson effect of a thermoelectric effect. Therefore, a phase change caused by the occurrence of heat by the read current I_R may occur in only a portion M_R2 of the variable resistance element R, and thus, read disturbance caused by the occurrence of heat may be reduced.

Figure 8A:
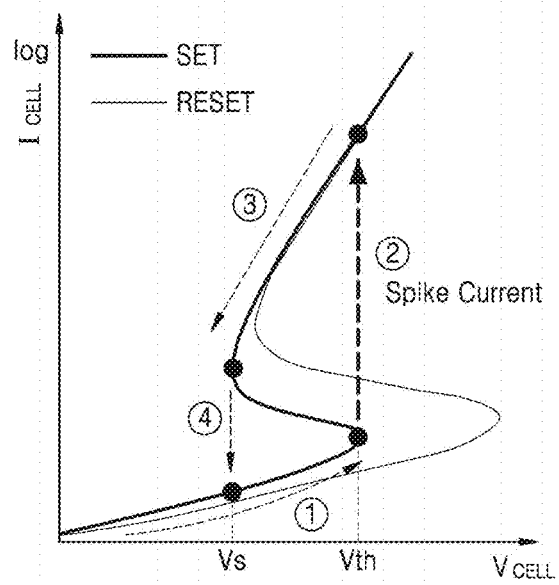
FIG. 8A is a graph showing a voltage-current log curve of a selection element according to some example embodiments.
Figure 8B:
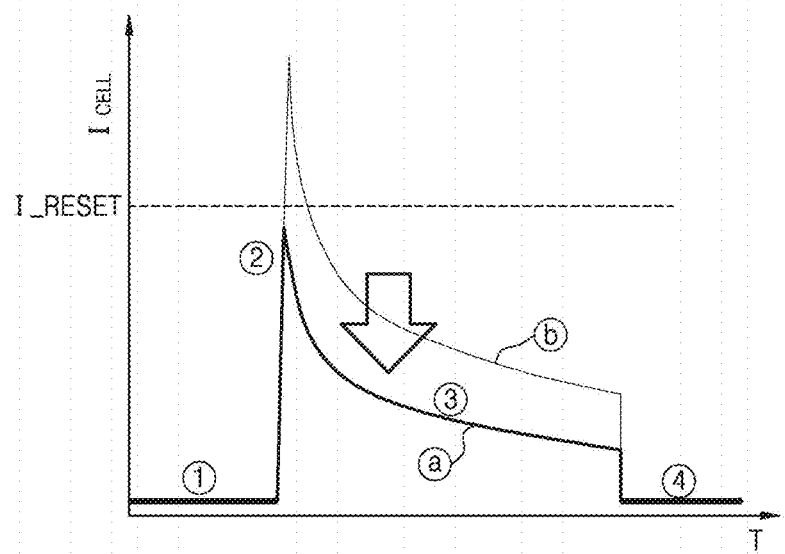
FIG. 8B is a graph showing a spike current according to each of some example embodiments and a comparative example.
Figure 8C:
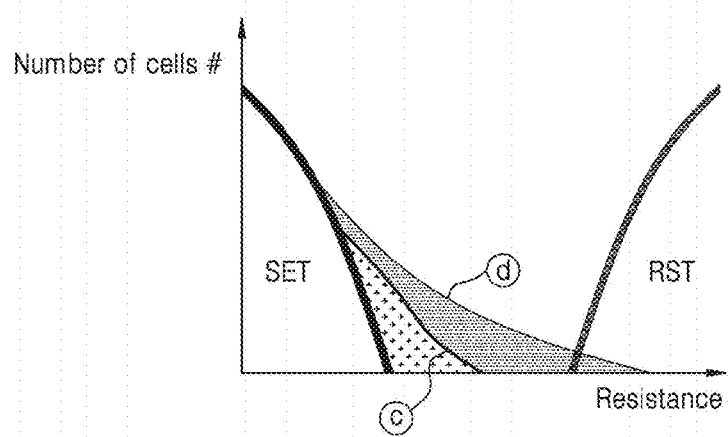
FIG. 8C is a graph showing a resistance value distribution of memory cells according to each of some example embodiments and a comparative example.

FIG. 8A is a graph showing a voltage-current log curve of a selection element according to some example embodiments. FIG. 8B is a graph showing a spike current according to each of some example embodiments and a comparative example. FIG. 8C is a graph showing a resistance value distribution of memory cells according to each of some example embodiments and a comparative example.

Referring to FIG. 8A, when a voltage $V_{CELL}$ applied to a selection element SW increases gradually from a voltage "0" to a threshold voltage Vth, a current $I_{CELL}$ may hardly flow in the selection element SW (①). However, the voltage applied to the selection element SW may exceed the threshold voltage Vth, the current flowing in the selection element SW may rapidly increase at the same time, and a spike current may occur (②). Subsequently, the voltage applied to the selection element SW may decrease up to a saturation voltage Vs (③), and as a current applied to a memory cell MC decreases, the voltage applied to the selection element SW may be maintained as the saturation voltage Vs (④). Such a characteristic of the selection element SW may be referred to as a snapback characteristic.

Referring to FIG. 8B, at steps ① to ④, a graph ⓐ of a current applied to a selection element of a memory device according to some example embodiments and a graph ⓐ of a current applied to a selection element of a memory device according to a comparative example are shown. A spike current applied to the selection element according to the comparative example at step ② may have a level, which is higher than that of a write current I_RESET (particularly, a reset current), for a certain time. On the other hand, a spike current applied to the selection element according to some example embodiments at step ② may have a level which is lower than that of the reset current. Accordingly, the memory device according to some example embodiments may solve a problem where a memory cell is damaged by a spike current.

Referring to FIG. 8C, a distribution representing the number of cells with respect to a resistance value is shown. In FIG. 8C, ⓒ may represent a distribution of the memory device according to some example embodiments, and ⓓ may represent a distribution according to the comparative example. In the comparative example, due to a spike current occurring in a data reading operation, a set resistance distribution (SET) may be widened, and thus, a portion of the set resistance distribution (SET) may overlap a portion of a reset resistance distribution (RESET, RST). On the other hand, in some example embodiments, a level of a spike current occurring in the data reading operation may be improved, and thus, the degradation in the set resistance distribution (SET) caused by the spike current may be reduced.

Figure 9:
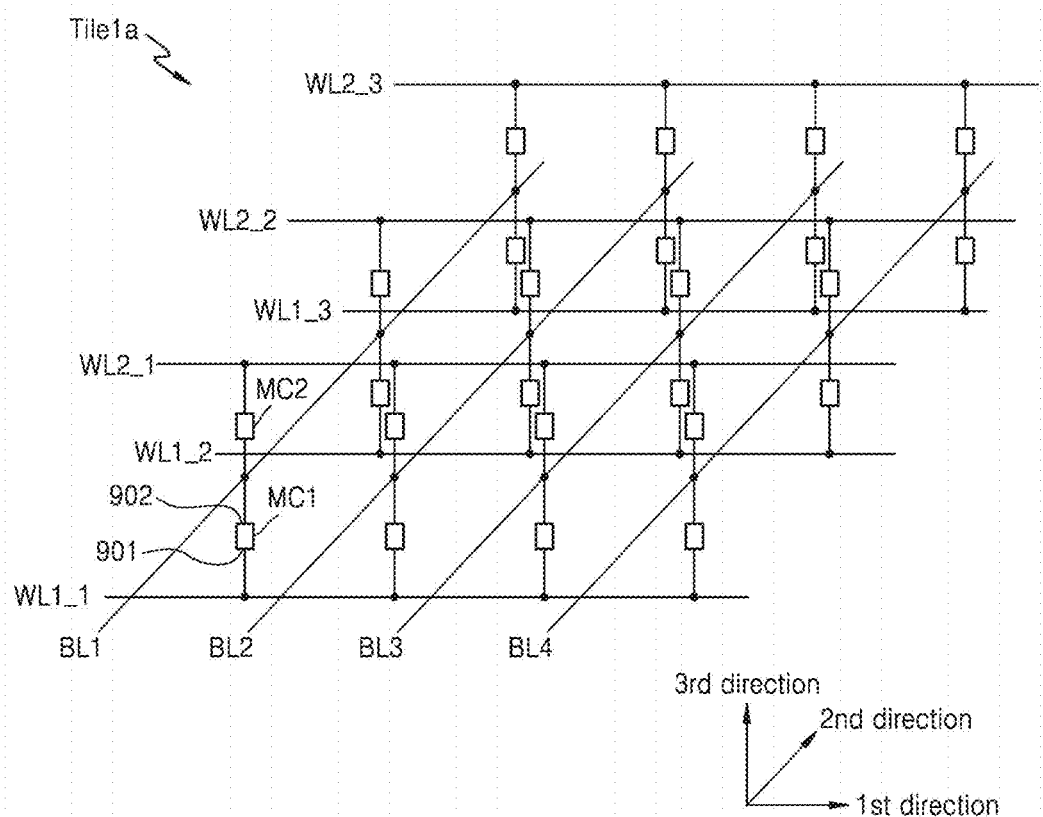
FIG. 9 is a circuit diagram illustrating an implementation example of a tile according to some example embodiments.

FIG. 9 is a circuit diagram illustrating an implementation example of a tile according to some example embodiments.

Referring to FIG. 9, a tile Tile 1a may include a plurality of first word lines WL1_1 to WL1_3, a plurality of second word lines WL2_1 to WL2_3, and a plurality of bit lines BL1 to BL4. The first word lines WL1_1 to WL1_3, the plurality of second word lines WL2_1 to WL2_3, or a combination thereof may be referred to herein as a plurality of second signal lines, and the plurality of bit lines BL1 to BL4 may be referred to herein as a plurality of first signal lines. In some example embodiments, the tile Tile 1a may include a plurality of memory cells (for example, MC1) disposed between the plurality of first word lines WL1_1 to WL1_3 and the plurality of bit lines BL1 to BL4 and a plurality of memory cells (for example, MC2) disposed between the plurality of second word lines WL2_1 to WL2_3 and the plurality of bit lines BL1 to BL4. That is, the tile Tile 1a may be implemented with a plurality of memory cells (for example, MC1 or MC2) arranged in a three-dimensional (3D) structure. Here, the number of first word lines, the number of second word lines, and the number of bit lines may be variously modified according to some example embodiments.

The first word lines WL1_1 to WL1_3 may be arranged at certain intervals in a second direction and may extend in a first direction. The bit lines BL1 to BL4 may be arranged at certain intervals in the first direction and may extend in the second direction. The bit lines BL1 to BL4 may be spaced apart from the first word lines WL1_1 to WL1_3 in a third direction. Restated, and as shown in at least FIG. 9, the bit lines BL1 to BL4 (e.g., plurality of first signal lines) may be spaced apart from one another in a first direction and may each extend in a second direction that is perpendicular to the first direction, and the first word lines WL1_1 to WL1_3 (e.g., the plurality of second signal lines) may be spaced apart from one another in the second direction and may each extend in the first direction, where the first word lines WL1_1 to WL1_3 are further spaced apart from the bit lines BL1 to BL4 in a third direction, where the third direction is perpendicular to both the first direction and the second direction. Furthermore, where the plurality of second signal lines includes the first word lines WL1_1 to WL1_3 and the second word lines WL2_1 to WL2_3, it will be understood that the first word lines WL1_1 to WL1_3 and the second word lines WL2_1 to WL2_3 may be spaced apart from each other in the third direction, as shown in at least FIG. 9.

The second word lines WL2_1 to WL2_3 may be arranged at certain intervals in the second direction and may extend in the first direction. The second word lines WL2_1 to WL2_3 may be spaced apart from the bit lines BL1 to BL4 in the third direction.

In the memory cells, memory cells (for example, MC1) each including one end 901 (e.g., a first end) connected to one of the first word lines WL1_1 to WL1_3 and another end 902 (e.g., a second end) connected to one of the bit lines BL1 to BL4 may configure a first layer. In the memory cells, memory cells (for example, MC2) each including one end connected to one of the bit lines BL1 to BL4 and another end connected to one of the second word lines WL2_1 to WL2_3 may configure a second layer. Therefore, the tile Tile 1a may have a structure where a plurality of layers are stacked. In some example embodiments, only two layers are illustrated, but are not limited thereto. In other embodiments, a plurality of layers may be further provided in the same connection manner.

In some example embodiments, in memory cells included in at least one of the first and second layers, a direction of a write current applied thereto in a data writing operation may differ from a direction of a read current applied thereto in a data reading operation. For example, in a data writing operation performed on a first memory cell MC1, the write current may be applied through a first bit line BL1, and thus, may flow in a direction toward the first bit line BL1, a first memory cell MC1, and a first word line WL1_1. Restated, a write circuit 150 (shown in FIG. 1) may supply ("apply," "output," or the like) a write current to at least one memory cell (e.g., memory cell MC1) such that the write current flows from a corresponding first signal line (e.g., bit line BL1) to a corresponding second signal line (e.g., word line WL1_1) via the at least one memory cell (e.g., MC1). In some example embodiments, in a data reading operation performed on the first memory cell MC1, the read current may be applied through the first word line WL1_1, and thus, may flow in a direction toward the first word line WL1_1, the first memory cell MC1, and the first bit line BL1. Restated, a read circuit 160 (shown in FIG. 1) may supply ("apply," "output," or the like) a read current to at least one memory cell (e.g., memory cell MC1) such that the write memory current flows from a corresponding second signal line (e.g., word line WL1_1) to a corresponding first signal line (e.g., bit line BL1) via the at least one memory cell (e.g., MC1).

Figure 10:
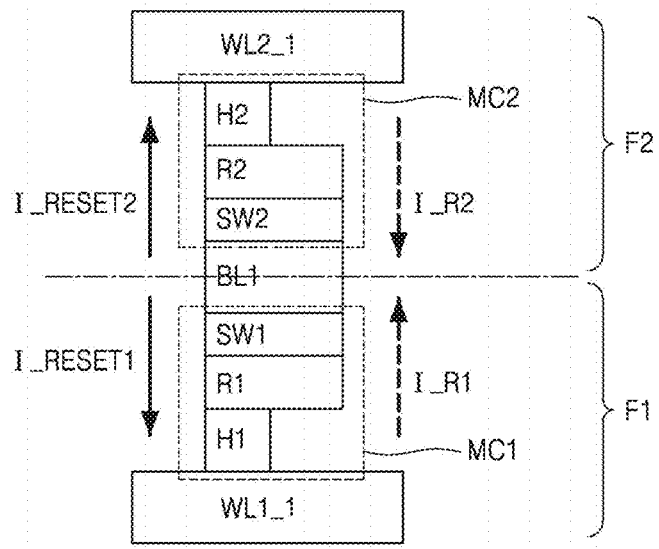
FIG. 10 is a diagram for describing a direction of a current applied when performing a write operation and a read operation, according to some example embodiments.

FIG. 10 is a diagram for describing a direction of a current applied when performing a write operation and a read operation, according to some example embodiments. For example, FIG. 10 illustrates an example of first and second memory cells MC1 and MC2 of FIG. 9.

Referring to FIG. 10, a second memory cell MC2 included in a second layer F2 may be disposed on a first memory cell MC1 included in a first layer F1. The first memory cell MC1 may include a first heating element H1, a first variable resistance element R1, and a first selection element SW1, and the second memory cell MC2 may include a second heating element H2, a second variable resistance element R2, and a second selection element SW2.

Figure 11:
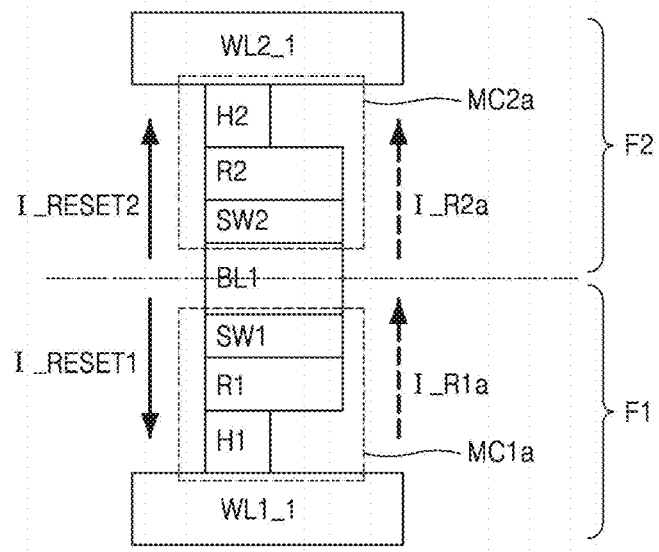
FIG. 11 is a diagram for describing a direction of a current applied when performing a write operation and a read operation, according to some example embodiments.

Referring to FIGS. 9-11 generally, it will be understood that memory cell array 110 may include a first layer F1 and a second layer F2, where the first layer F1 includes a plurality of first memory cells MC1, where each first memory cell MC1 is connected at one end of the first memory cell MC1 to one bit line (e.g. BL1) of the plurality of bit lines BL1 to BL4 and connected at another end of the first memory cell MC1 to one first word line (e.g., WL1_1) of the plurality of first word lines WL1_1 to WL1_4, and the second layer includes a plurality of second memory cells MC2, where each second memory cell MC2 is connected at one end of the second memory cell MC2 to one bit line (e.g., BL1) of the plurality of bit lines BL1 to BL4 and connected at another end of the second memory cell MC2 to one second word line (e.g., WL2_1) of the plurality of second word lines WL2_1 to WL2_4.

In some example embodiments, the first heating element H1 may be stacked on a corresponding first word line WL1_1, the first variable resistance element R1 may be stacked on the first heating element H1, the first selection element SW1 may be stacked on the first variable resistance element R1, and a corresponding first bit line (e.g., BL1) may be stacked on the first selection element SW1. In some example embodiments, the second selection element SW2 may be stacked on a corresponding first bit line BL1, the second variable resistance element R2 may be stacked on the second selection element SW2, the second heating element H2 may be stacked on the second variable resistance element R2, and a corresponding second word line (e.g., WL2_1) may be stacked on the second heating element H2.

In a data writing operation, a first write current I_RESET1 may be applied to the first memory cell MC1 through the first bit line BL1. Therefore, the first write current I_RESET1 may flow from the first bit line BL1 to the first word line WL1_1 via the first selection element SW1, the first variable resistance element R1, and the first heating element H1. In some example embodiments, in a data writing operation, a second write current I_RESET2 may be applied to the second memory cell MC2 through the first bit line BL1. Therefore, the second write current I_RESET2 may flow from the first bit line BL1 to a second word line WL2_1 via the second selection element SW2, the second variable resistance element R2, and the second heating element H2.

For example, the first write current I_RESET1 and the second write current I_RESET2 may be the same current which is applied when performing the same write operation. As another example, the first write current I_RESET1 and the second write current I_RESET2 may be different currents which are applied when performing different write operations.

In a data reading operation, a first read current I_R1 may be applied to the first memory cell MC1 through the first word line WL1_1. Therefore, the first read current I_R1 may flow from the first word line WL1_1 to the first bit line BL1 via the first heating element H1, the first variable resistance element R1, and the first selection element SW1. Restated, the read circuit 160 may be configured to supply a first read current I_R1 such that that the first read current I_R1 flows from a corresponding first word line (e.g., WL1_1) to a corresponding bit line (e.g., BL1) via a corresponding first memory cell (e.g., MC1) to support a read operation performed on the plurality of first memory cells MC1. In some example embodiments, in a data reading operation, a second read current I_R2 may be applied to the second memory cell MC2 through the second word line WL2_1. Therefore, the second read current I_R2 may flow from the second word line WL2_1 to the first bit line BL1 via the second heating element H2, the second variable resistance element R2, and the second selection element SW2. Restated, the read circuit 160 may be configured to supply a second read current I_R2 such that that the second read current I_R2 flows from a corresponding second word line (e.g., WL2_1) to a corresponding bit line (e.g., BL1) via a corresponding second memory cell (e.g., MC2) to support a read operation performed on the plurality of second memory cells MC2.

For example, the first read current I_R1 and the second read current I_R2 may be the same current which is applied when performing the same read operation. As another example, the first read current I_R1 and the second read current I_R2 may be different currents which are applied when performing different read operations.

FIG. 11 is a diagram for describing a direction of a current applied when performing a write operation and a read operation, according to some example embodiments. Descriptions of elements, which are the same as the elements of FIG. 10, of elements illustrated in FIG. 11 will be omitted.

Referring to FIG. 11, a direction of a first read current I_R1a which is applied when a data reading operation is being performed on a first memory cell MC1a may differ from a direction of a second read current I_R2a which is applied when a data reading operation is being performed on a second memory cell MC2a. In other words, a read current applied to memory cells included in a first layer F1 and a read current applied to memory cells included in a second layer F2 may be applied in different directions.

For example, in a data reading operation performed on the first memory cell MC1a, the first read current I_R1a may be applied through a first word line WL1_1. Therefore, the first read current I_R1a may flow from the first word line WL1_1 to a first bit line BL1 via a first heating element H1, a first variable resistance element R1, and a first selection element SW1. Restated, the read circuit 160 may be configured to supply a first read current I_R1a such that that the first read current I_R1a flows from a corresponding first word line (e.g., WL1_1) to a corresponding bit line (e.g., BL1) via a corresponding first memory cell (e.g., MC1) to support a read operation performed on the plurality of first memory cells MC1.

In a data reading operation performed on the second memory cell MC2a, the second read current I_R2a may be applied through the first bit line BL1. Therefore, the second read current I_R2a may flow from the first bit line BL1 to a second word line WL2_1 via a second selection element SW2, a second variable resistance element R2, and a second heating element H2. Restated, the read circuit 160 may be configured to supply a second read current I_R2a such that that the second read current I_R2a flows from a corresponding bit line (e.g., BL1) to a corresponding second word line (e.g., WL2_1) via a corresponding second memory cell (e.g., MC2) to support a read operation performed on the plurality of second memory cells MC2.

Figure 12:
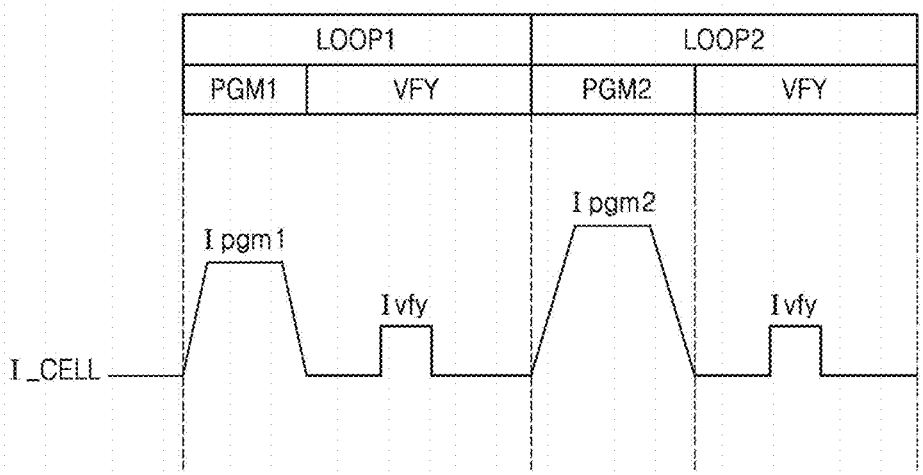
FIG. 12 is a timing diagram of a write current applied to a memory cell, according to some example embodiments.

FIG. 12 is a timing diagram of a write current applied to a memory cell (I_CELL), according to some example embodiments. FIG. 12 may be a timing diagram showing a level of a current applied to a memory cell (for example, MC of FIG. 4) in, for example, a data writing operation.

Referring to FIG. 12, a plurality of loops LOOP1 and LOOP2 may be sequentially performed, and thus, data may be written in a memory cell MC. The loop LOOP1 may be divided into a write period PGM1 and a write verification period VFY, and the loop LOOP2 may be divided into a write period PGM2 and a write verification period VFY. In the write periods PGM1 and PGM2, write pulses Ipgm1 and Ipgm2 respectively corresponding to the loops LOOP1 and LOOP2 may be input through one of a word line and a bit line. As a corresponding loop is progressively performed, the write pulses Ipgm1 and Ipgm2 may increase in amplitude.

In the write verification period VFY of each of the loops LOOP1 and LOOP2, a read operation of detecting whether writing of data based on the write pulses Ipgm1 and Ipgm2 respectively corresponding to the loops LOOP1 and LOOP2 succeeds may be performed. In some example embodiments, in the write verification period VFY, a verify pulse Ivfy may be applied through a line, differing from a line to which each of the write pulses Ipgm1 and Ipgm2 is input, of the word line and the bit line. For example, the write pulses Ipgm1 and Ipgm2 may be applied to a memory cell MC through the bit line, and the verify pulse Ivfy may be applied to the memory cell MC through the word line. In some example embodiments, in the write verification period VFY, different verify pulses may be applied at a plurality of steps. In some example embodiments, only two loops are illustrated. However, this is merely for convenience of description, but the number of loops is not limited thereto.

Figure 13:
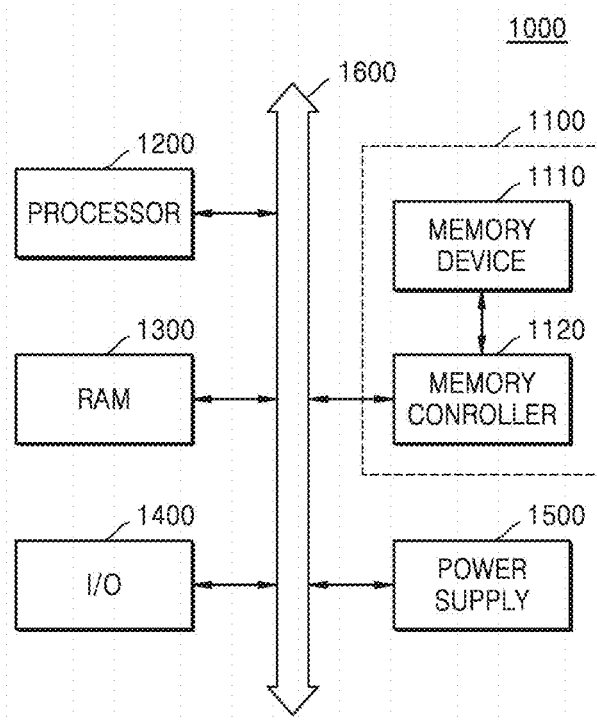
FIG. 13 is a block diagram illustrating a computing system including a memory system according to some example embodiments.

FIG. 13 is a block diagram illustrating a computing system 1000 including a memory system according to some example embodiments.

Referring to FIG. 13, the computing system 1000 may include a memory system 1100, a processor 1200, RAM 1300, an input/output (I/O) device 1400, and a power supply 1500. Although not shown in FIG. 13, the computing system 1000 may further include a plurality of ports for communicating with a video card, a sound card, a memory card, and an USB device, or communicating with other electronic devices. The computing system 1000 may be implemented as a personal computer (PC), or may be implemented as a portable electronic device such as a notebook computer, a portable phone, a personal digital assistant (PDA), a smartphone, or a camera.

The processor 1200 may perform arithmetic operations or tasks. According to some example embodiments, the processor 1200 may be a microprocessor, a central processing unit (CPU), or the like. The processor 1200 may communicate with the RAM 1300, the I/O device 1400, and the memory system 1100 through a bus 1600 such as an address bus, a control bus, or a data bus. According to some example embodiments, the processor 1200 may be connected to an extension bus such as a peripheral component interconnect (PCI) bus.

The memory system 1100 may include a memory device 1110 and a memory controller 1120. In this case, the memory system 1100 may be implemented by using the embodiments of FIGS. 1 to 12. Accordingly, data stored in the memory system 1100 may be enhanced in reliability.

The RAM 1300 may store data needed for an operation of the computing system 1000. For example, the RAM 1300 may be implemented with dynamic random access memory (DRAM), mobile DRAM, static random access memory (SRAM), PRAM, ferroelectric random access memory (FeRAM), resistive random access memory (ReRAM), and/or magnetic random access memory (MRAM).

The I/O device 1400 may include an input means such as a keyboard, a keypad, or a mouse device, a printer, and an output means such as a display. The power supply 1500 may supply a dynamic voltage needed for the operation of the computing system 1000.

While the inventive concepts have been particularly shown and described with reference to embodiments thereof, it will be understood that various changes in form and details may be made therein without departing from the spirit and scope of the following claims.

What is claimed is:

1. A resistive memory device, comprising:
   a plurality of first signal lines and a plurality of second signal lines, each second signal line of the plurality of second signal lines intersecting each first signal line of the plurality of first signal lines;
   a memory cell array including a plurality of memory cells, each memory cell of the plurality of memory cells being connected at a first end to one of the plurality of first signal lines and connected at a second end to one of the plurality of second signal lines;
   a write circuit configured to supply a write current to at least one memory cell of the plurality of memory cells through at least one first signal line of the plurality of first signal lines, the write current associated with writing data in the at least one memory cell; and
   a read circuit configured to supply a read current to the at least one memory cell of the plurality of memory cells through at least one second signal line of the plurality of second signal lines, the read current associated with reading data stored in the at least one memory cell.

2. The resistive memory device of claim 1, wherein
the at least one memory cell includes a variable resistance element, a selection element, and a heating element,
one end of the selection element is connected to one of the plurality of first signal lines, and another end of the selection element is connected to the variable resistance element,
one end of the variable resistance element is connected to the selection element, and another end of the variable resistance element is connected to the heating element, and
one end of the heating element is connected to the variable resistance element, and another end of the heating element is connected to one of the plurality of second signal lines.

3. The resistive memory device of claim 2, wherein the selection element includes an ovonic threshold switch.

4. The resistive memory device of claim 1, wherein
the plurality of first signal lines includes a plurality of bit lines, and
the plurality of second signal lines includes a plurality of word lines.

5. The resistive memory device of claim 1, further comprising:
an instance of control circuitry configured to generate a write control signal to control a data writing operation and a read control signal to control a data reading operation;
a column decoder circuit configured to electrically connect the write circuit to at least one of the plurality of first signal lines, based on the write control signal; and
a row decoder circuit configured to electrically connect the read circuit to at least one second signal line of the plurality of second signal lines, based on the read control signal.

6. The resistive memory device of claim 5, wherein
the row decoder circuit includes a first transistor, a second transistor, and a third transistor, the first to third transistors each configured to be switched according to control based on the read control signal,
the first transistor is connected at one end of the first transistor to an inhibit voltage and is connected at another end of the first transistor to one of the plurality of second signal lines,
the second transistor is connected at one end of the second transistor to the read circuit and is connected at another end of the second transistor to the one of the plurality of second signal lines, and
the third transistor is connected at one end of the third transistor to a ground voltage and is connected at another end of the third transistor to the one of the plurality of second signal lines.

7. The resistive memory device of claim 6, wherein the data reading operation includes switching the second transistor on and switching both the first transistor and the third transistor off.

8. The resistive memory device of claim 6, wherein the data writing operation includes switching the third transistor on and switching both the first transistor and the second transistor off.

9. The resistive memory device of claim 5, wherein
the column decoder circuit includes a fourth transistor, a fifth transistor, and a sixth transistor, the fourth to sixth transistors each configured to be switched according to control based on the write control signal,
the fourth transistor is connected at one end of the fourth transistor to the write circuit and is connected at another end of the fourth transistor to one of the plurality of first signal lines,
the fifth transistor is connected at one end of the fifth transistor to an inhibit voltage and is connected at another end of the fifth transistor to the one of the plurality of first signal lines, and
the sixth transistor is connected at one end of the sixth transistor to a ground voltage and is connected at another end of the sixth transistor to the one of the plurality of first signal lines.

10. The resistive memory device of claim 9, wherein the data reading operation includes switching the sixth transistor on and switching both the fourth transistor and the fifth transistor off.

11. The resistive memory device of claim 9, wherein the data writing operation includes switching the fourth transistor on and switching both the fifth transistor and the sixth transistor off.

12. A resistive memory device, comprising:
a plurality of first signal lines spaced apart from one another in a first direction, the plurality of first signal lines each extending in a second direction perpendicular to the first direction;
a plurality of second signal lines spaced apart from one another in the second direction, the plurality of second signal lines each extending in the first direction, the plurality of second signal lines spaced apart from the plurality of first signal lines in a third direction, the third direction perpendicular to both the first direction and the second direction;
a memory cell array including a plurality of memory cells, each memory cell of the plurality of memory cells being connected at a first end to one of the plurality of first signal lines and connected at a second end to one of the plurality of second signal lines;
a write circuit configured to supply a write current to at least one memory cell of the plurality of memory cells, such that the write current flows from a corresponding first signal line of the plurality of first signal lines to a corresponding second signal line of the plurality of second signal lines via the at least one memory cell, the write current associated with writing data in the at least one memory cell; and
a read circuit configured to supply a read current to the at least one memory cell, such that the read current flows from the corresponding second signal line to the corresponding first signal line via the at least one memory cell, the read current associated with reading data stored in the at least one memory cell.

13. The resistive memory device of claim 12, wherein
the plurality of first signal lines includes a plurality of bit lines,
the plurality of second signal lines comprise a plurality of first word lines and a plurality of second word lines, the plurality of first word lines and the plurality of second word lines spaced apart from each other in the third direction, and
the memory cell array further includes
a first layer including a plurality of first memory cells, each first memory cell of the plurality of first memory cells connected at one end of the first memory cell to one of the plurality of bit lines and connected at another end of the first memory cell to one of the plurality of first word lines; and
a second layer including a plurality of second memory cells, each second memory cell of the plurality of second memory cells connected at one end of the second memory cell to one of the plurality of bit lines and connected at another end of the second memory cell to one of the plurality of second word lines.

14. The resistive memory device of claim 13, wherein,
the read circuit is configured to supply a first read current such that that the first read current flows from a corresponding first word line of the plurality of first word lines to a corresponding bit line of the plurality of bit lines via a corresponding first memory cell of the plurality of first memory cells to support a read operation performed on the plurality of first memory cells, and
the read circuit is configured to supply a second read current such that that the second read current flows from a corresponding second word line of the plurality of second word lines to the corresponding bit line of the plurality of bit lines via a corresponding second memory cell of the plurality of second memory cells to support a read operation performed on the plurality of second memory cells.

15. The resistive memory device of claim 13, wherein,
the read circuit is configured to supply a first read current such that the first read current flows from a corresponding first word line of the plurality of first word lines to a corresponding bit line of the plurality of bit lines via a corresponding first memory cell of the plurality of first memory cells to support a read operation performed on the plurality of first memory cells, and
the read circuit is configured to supply a second read current such that the second read current flows from the corresponding bit line of the plurality of bit lines to a corresponding second word line of the plurality of second word lines via a corresponding second memory cell of the plurality of second memory cells to support a read operation performed on the plurality of second memory cells.

16. The resistive memory device of claim 13, wherein
at least one first memory cell of the plurality of first memory cells includes a first variable resistance element, a first selection element, and a first heating element, and
the first heating element is stacked on a corresponding first word line of the plurality of first word lines, the first variable resistance element is stacked on the first heating element, the first selection element is stacked on the first variable resistance element, and a corresponding bit line of the plurality of bit lines is stacked on the first selection element.

17. The resistive memory device of claim 13, wherein
at least one second memory cell of the plurality of second memory cells includes a second variable resistance element, a second selection element, and a second heating element, and
the second selection element is stacked on a corresponding bit line of the plurality of bit lines, the second variable resistance element is stacked on the second selection element, the second heating element is stacked on the second variable resistance element, and a corresponding second word line of the plurality of second word lines is stacked on the second heating element.

* * * * *